United States Patent
Jiang et al.

(10) Patent No.: US 11,687,560 B2
(45) Date of Patent: Jun. 27, 2023

(54) DATABASE REPLICATION USING ADAPTIVE COMPRESSION

(71) Applicant: International Business Machines Corporation, Armonk, NY (US)

(72) Inventors: Peng Hui Jiang, Beijing (CN); Xiao Yi Tian, Beijing (CN); Di Li Hu, Beijing (CN); XiangXing Shi, Beijing (CN); Xian Wei Zhang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 17/377,431

(22) Filed: Jul. 16, 2021

(65) Prior Publication Data
US 2023/0022619 A1    Jan. 26, 2023

(51) Int. Cl.
   *G06F 16/27* (2019.01)
   *G06F 16/22* (2019.01)
   *G06F 16/2455* (2019.01)
   *H03M 7/30* (2006.01)

(52) U.S. Cl.
   CPC .......... *G06F 16/27* (2019.01); *G06F 16/2282* (2019.01); *G06F 16/24568* (2019.01); *H03M 7/3084* (2013.01)

(58) Field of Classification Search
   CPC .. G06F 16/27; G06F 16/2456; G06F 16/2282; H03M 7/3084
   USPC .......................................................... 707/620
   See application file for complete search history.

(56) References Cited

U.S. PATENT DOCUMENTS

| | | | |
|---|---|---|---|
| 8,495,010 B2 | 7/2013 | Moore | |
| 9,418,133 B2 | 8/2016 | Huang | |
| 9,575,982 B1* | 2/2017 | Sankara Subramanian ................. G06F 3/0608 | |
| 2008/0071818 A1* | 3/2008 | Apanowicz ............. H03M 7/30 | |
| 2015/0088830 A1* | 3/2015 | Kamp ................. G06F 16/2453 707/648 | |
| 2015/0112938 A1 | 4/2015 | Swift | |
| 2016/0085834 A1* | 3/2016 | Gleeson ................ G06F 16/273 707/693 | |
| 2017/0060976 A1 | 3/2017 | Harnik | |
| 2017/0161348 A1 | 6/2017 | Araki | |

(Continued)

OTHER PUBLICATIONS

"Facebook / zstd", GitHub, downloaded from the Internet on Mar. 31, 2021, 8 pages, <https://github.com/facebook/zstd>.

(Continued)

*Primary Examiner* — Robert W Beausoliel, Jr.
*Assistant Examiner* — Arthur Ganger
(74) *Attorney, Agent, or Firm* — Stephanie T. Canisi Hn

(57) ABSTRACT

Methods, computer program products, and/or systems are provided that perform the following operations: in a data replication environment, analyzing a database workload to generate a knowledge base of information related to compression; dividing a transfer data stream into different segments based, at least in part, on the knowledge base; obtaining candidate compression types for the transfer data stream based, at least in part, on the knowledge base; assigning respective compression types of the candidate compression types to the different segments; generating compressed segments based, at least in part, on the respective compression types assigned to the different segments; and providing the compressed segments to a replication target.

20 Claims, 11 Drawing Sheets

(56) References Cited

U.S. PATENT DOCUMENTS

2020/0387495 A1* 12/2020 Pathak .................. G06F 3/064
2021/0034598 A1* 2/2021 Arye ..................... G06F 16/288

OTHER PUBLICATIONS

"Google / brotli", GitHub, downloaded from the Internet on Mar. 31, 2021, 5 pages, <https://github.com/google/brotli>.

"Google / snappy", GitHub, downloaded from the Internet on Mar. 31, 2021, 6 pages, <https://github.com/google/snappy>.

"Lempel-Ziv-Markov chain algorithm", Wikipedia, This page was last edited on Mar. 23, 2021, 20 pages, <https://en.wikipedia.org/wiki/Lempel-Ziv-Markov_chain_algorithm>.

"lz4 / lz4", GitHub, downloaded from the Internet on Mar. 31, 2021, 4 pages, <https://github.com/lz4/lz4>.

"QuickLZ 1.5 x", Fast compression library for C, C# and Java, downloaded from the Internet on Mar. 31, 2021, 3 pages, <http://www.quicklz.com/>.

"Zlib", A Massively Spiffy Yet Delicately Unobtrusive Compression Library (Also Free, Not to Mention Unencumbered by Patents), downloaded from the Internet on Mar. 31, 2021, 5 pages, <https://zlib.net/>.

Anuradha et al., "A Detailed Review on the Prominent Compression Methods Used for Reducing the Data Volume of Big Data", Ann. Data. Sci. (2016) 3(1):47-62, DOI 10.1007/s40745-016-0069-9, 9 pages.

Devarajan et al., "An Intelligent, Adaptive, and Flexible Data Compression Framework", 2019 19th IEEE/ACM International Symposium on Cluster, Cloud and Grid Computing (CCGRID), pp. 82-91, DOI: 10.1109/CCGRID.2019.00019.

* cited by examiner

DATABASE REPLICATION USING ADAPTIVE COMPRESSION

BACKGROUND

The present invention relates generally to the field of data management, and more particularly to the use of adaptive data compression in database replication.

SUMMARY

According to an aspect of the present invention, there is a method, computer program product and/or system that performs the following operations (not necessarily in the following order): in a data replication environment, analyzing a database workload to generate a knowledge base of information related to compression; dividing a transfer data stream into different segments based, at least in part, on the knowledge base; obtaining candidate compression types for the transfer data stream based, at least in part, on the knowledge base; assigning respective compression types of the candidate compression types to the different segments; generating compressed segments based, at least in part, on the respective compression types assigned to the different segments; and providing the compressed segments to a replication target.

DETAILED DESCRIPTION

Figure 1:
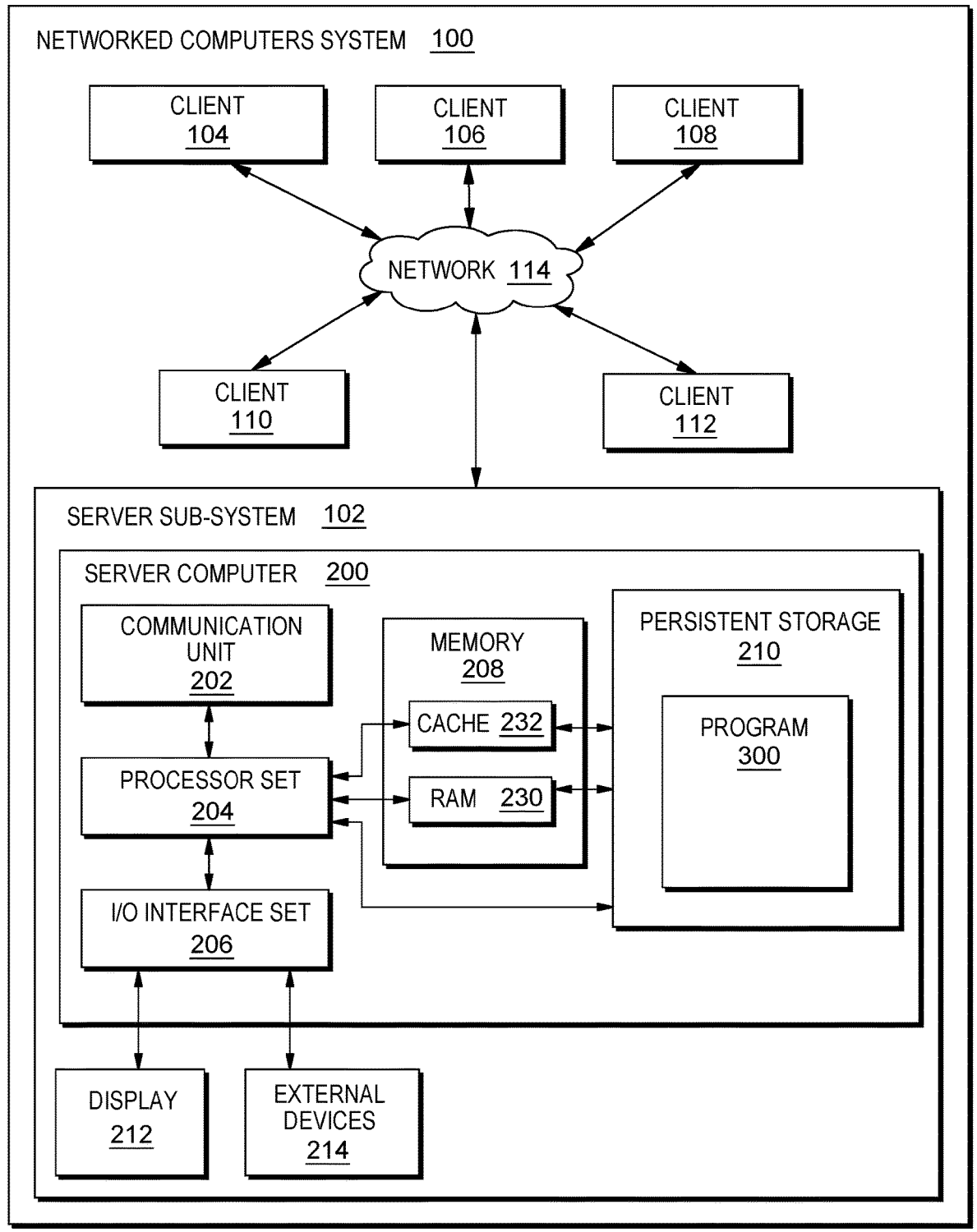
FIG. 1 depicts a block diagram view of a first embodiment of a system, according to the present invention.

According to aspects of the present disclosure, systems and methods can be provided to provide adaptive compression for database replication data streams. In particular, systems and methods of the present disclosure can provide for generating a compression knowledge base based on analysis of a database and database workload and using the compression knowledge base to provide adaptive compression. The systems and methods of the present disclosure can provide for separating a replication transfer data stream into segments and determining a compression type for each segment, for example, based at least in part on a compression knowledge base. The systems and methods of the present disclosure can provide for compressing the data segments and providing the compressed segments to a replication target. In some embodiments, the systems and methods of the present disclosure can provide for decompressing the data segments in a replication target.

In general, data replication is the process of making multiple copies of data and storing the copies of the data at different locations, for example, to improve the overall accessibility of the data across a network. Data replication may be used in distributed database systems, data stores, and the like. In such environments, it is usually inevitable to transfer data from one end to another end.

Often, compressing the replication data that is transferred through the network may save network bandwidth and might help reduce the amount of buffer memory used in the replication. On the other hand, compressing and decompressing data can require more CPU resources on both the source site and the server that manages the target datastore.

Accordingly, systems and methods of the present disclosure can provide for the use of adaptive compression in data replication. The systems and methods of the present disclosure can provide for analyzing a database and/or database workload to generate a compression knowledge base. In some embodiments, the systems and methods of the present disclosure can provide for dividing transfer data into different types and segments, for example, according to analyzed patterns of data. In some embodiments, the systems and methods of the present disclosure can provide for evaluating compression methods and ranking different compression types for associating with patterns of data. In some embodiments, the systems and methods of the present disclosure can provide for assigning different compression types to different transfer data segments, for example, based on a compression knowledge base. In some embodiments, the systems and methods of the present disclosure can provide for generating and transferring a compression sequence table along with compressed data segments from a replication source. In some embodiments, the systems and methods of the present disclosure can provide for decompressing compressed data segments in a replication target, for example, using a generated compression sequence table. In some embodiments, the systems and methods of the present disclosure can provide for analyzing usage patterns and adjusting compression types based on analyzed characteristics.

This Detailed Description section is divided into the following sub-sections: The Hardware and Software Environment; Example Embodiments; Further Comments and/or Embodiments; and Definitions.

The Hardware and Software Environment

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: server sub-system 102; client sub-systems 104, 106, 108, 110, 112; communication network 114; server computer 200; communication unit 202; processor set 204; input/output (I/O) interface set 206; memory device 208; persistent storage device 210; display device 212; external device set 214; random access memory (RAM) devices 230; cache memory device 232; and program 300.

Sub-system 102 is, in many respects, representative of the various computer sub-system(s) in the present invention.

Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine-readable instructions and/or data that can be used to create, manage, and control certain software functions, such as will be discussed in detail, below, in the Example Embodiment sub-section of this Detailed Description section. As an example, a program 300 can provide for analyzing databases and database workloads, generating a compression knowledge base, dividing transfer data streams into segments, determining compression types for different data segments, compressing data segments, de-compressing data segments, updating compression selections, updating a compression knowledge base, and/or the like.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions and/or substantive data (that is, the type of data stored in a database). For example, program 300 may include machine readable and performable instructions to provide for performance of method operations as disclosed herein. In this particular embodiment, persistent storage 210 includes a magnetic hard disk drive. To name some possible variations, persistent storage 210 may include a solid-state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor, a smart phone/tablet display screen, and/or the like.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

EXAMPLE EMBODIMENTS

Figure 2:
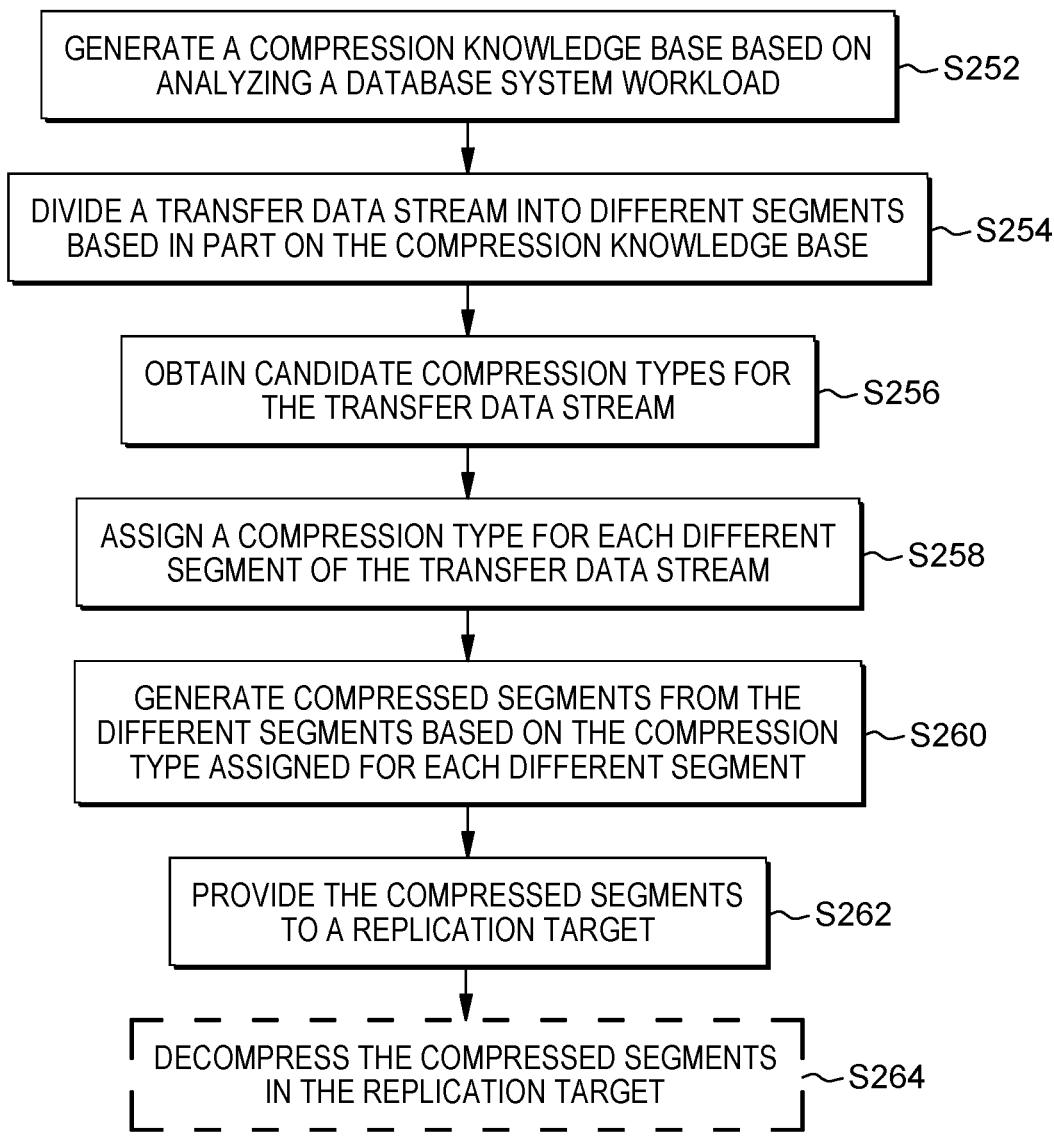
FIG. 2 depicts a flowchart showing a first embodiment method performed, at least in part, by the first embodiment system.
Figure 3:
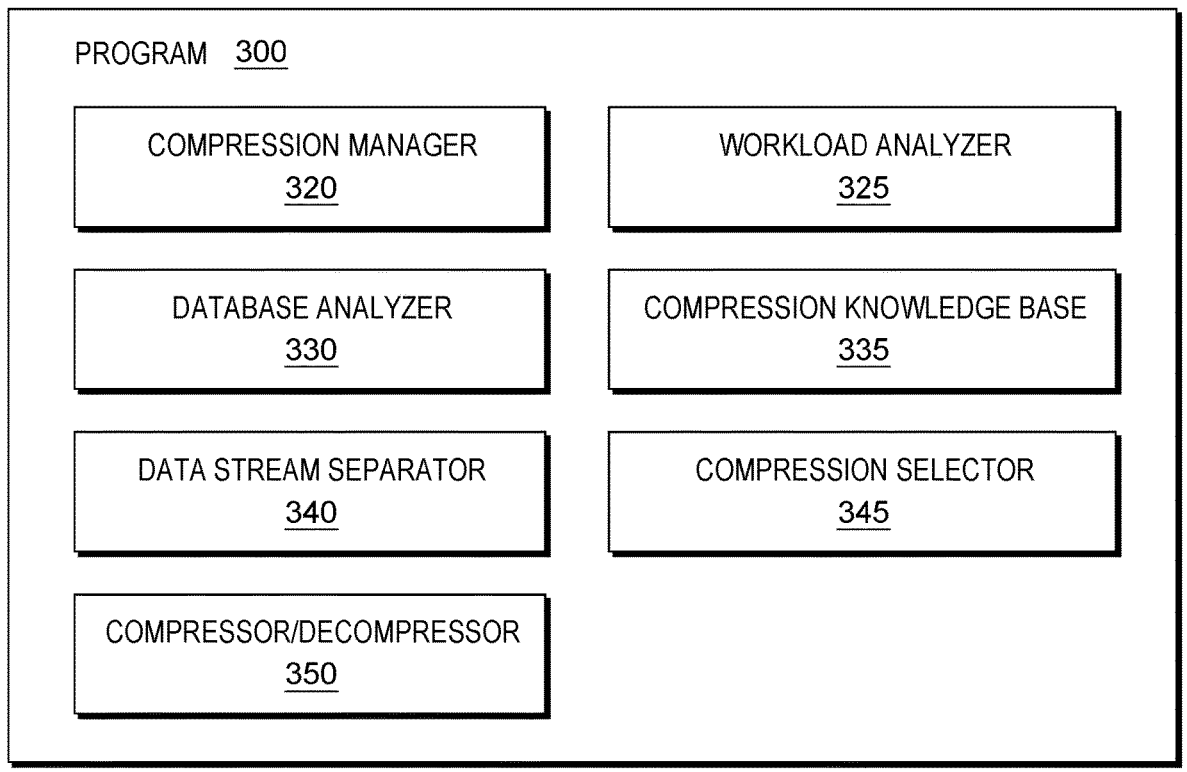
FIG. 3 depicts a block diagram showing an example machine logic (for example, software) portion of the first embodiment system.

FIG. 2 shows flowchart 250 depicting a computer-implemented method, according to embodiment(s) of the present invention. FIG. 3 shows a program 300 for performing at least some of the method operations of flowchart 250. Regarding FIG. 2, one or more flowchart blocks may be identified with dashed lines and represent optional steps that may additionally be included, but which are not necessarily required, in the depicted embodiments. This method and associated software will now be discussed, over the course of the following paragraphs, with extensive reference to FIG. 2 (for the method operation blocks) and FIG. 3 (for the software blocks).

As illustrated in FIG. 2, in some embodiments, operations for adaptive compression begin at operation S252, where a computing system (e.g., server computer 200 of FIG. 1 or the like) generates a compression knowledge base based on analyzing a database and/or database system workload. As an example, a workload analyzer 325 of FIG. 3, a database analyzer 330 of FIG. 3, and/or the like can provide for analyzing a database and/or database workload. A compression manager 320 of FIG. 3 and/or the like can provide for building a compression knowledge base (e.g., compression knowledge base 335, etc.) based on output from the workload analyzer 325, database analyzer 330, and/or the like. In some embodiments, a workload analyzer 325 can provide for analyzing the workload of database system(s), including, for example, query pattern(s), hot table(s), hot column(s), index usage, and/or the like. In some embodiments, a database analyzer 330 can provide for analyzing the schema, cardinalities, configuration, other characteristics, and/or the like of a distributed database. The compression manager 320 can build/generate a compression knowledge base for transferred data based, in part, on the database and/or workload analysis.

In some embodiments, the computing system (e.g., workload analyzer, etc.) can generate a set of workload queries including, for example, a set of SQL statements and individual frequencies of use. The computing system (e.g., workload analyzer, etc.) can determine frequently accessed tables and columns on the tables, indexes that are used, usage patterns for indexes, and/or the like. In some embodiments, the computing system (e.g., database analyzer, etc.) can analyze relational schema, cardinalities of tables, column cardinalities, other database design characteristics (e.g., indexes, partitioning, already chosen views, materialized views, etc.), and/or the like. The computing system (e.g., compression manager, etc.) can build a compression knowledge base, for example, based on output from workload analysis, database analysis, and/or the like. In some embodiments, a compression knowledge base (also referred to as a "knowledge base of information related to compression") can include data associated with and/or representative of a plurality of managed database elements, related workload and time span measurements, resource costing for different compression and decompression types, predictions for future cost, and/or the like.

Processing proceeds to operation S254, where the computing system (e.g., server computer 200 of FIG. 1 or the like) divides a transfer data stream (e.g., data being replicated, etc.) into different segments based, at least in part, on the compression knowledge base. As an example, a data stream separator 340 and/or the like can provide for dividing (and/or merging) the transfer data stream into a plurality of different segments. A data stream separator 340 and/or the like can use a compression knowledge base in determining how to divide (and/or merge) the transfer data stream. In some embodiments, the computing system (e.g., data stream separator, etc.) can provide for analyzing a transfer data stream, for example, according to type, characteristics, and/or the like, for use in determining how to divide (and/or merge) a transfer data stream. For example, in some embodiments, the computing system (e.g., data stream separator, etc.) can divide a transfer data stream into different types and segments based, at least in part, on analyzed patterns of data. In some embodiments, the data to be replicated in a database (e.g., transfer data stream, etc.) can include metadata and metrics data. In some embodiments, metadata may have higher value as compared to metrics data with regard to data replication.

Processing proceeds to operation S256, where the computing system (e.g., server computer 200 of FIG. 1 or the like) can obtain candidate compression types for the transfer data stream. As an example, a compression manager 320 of FIG. 3, compression selector 345 of FIG. 3, and/or the like can provide for obtaining candidate compression types for the transfer data stream. In some embodiments, for example, a compression selector 345 can provide for requesting candidate compression types from a compression manager. In some embodiments, a compression selector 345 can include data type information, metadata, and/or other information (e.g., associated with a transfer data stream, etc.) in a request for candidate compression types. A compression manager 320 can identify and send candidate compression types to the compression selector 345 to use in determining compression types for segments associated with the transfer data stream. In some embodiments, library version data, compression level data, and/or the like can be provided for each candidate compression type. In some embodiments, the computing system can evaluate compression types and determine ranks for the different compression types, for example, based in part on a compression knowledge base. In some embodiments, ranks for the compression types can be used in associating compression types with data patterns. In some embodiments, the compression types may include, for example: QuickLZ, zstd, Snappy, Lempel-Ziv-Markov chain algorithm (LZMA), zlib, LZ4, Broth, and/or the like.

Processing proceeds to operation S258, where the computing system (e.g., server computer 200 of FIG. 1 or the like) assigns a compression type for each different segment from the candidate compression types. As an example, a compression selector 345 of FIG. 3 and/or the like can provide for determining and/or assigning a compression type for each segment of a transfer data stream based on the candidate compression types. In some embodiments, for example, the computing system (e.g., compression selector, etc.) can determine (e.g., decide, select, etc.) a compression type from the candidate types according to current context.

As an example, in some embodiments, the selection/assignment of compression types may be based on CPU utilization for compression and/or decompression, memory utilization for compression and/or decompression, network utilization for compression and/or decompression, and/or the like. In some embodiments, compression types may be weight ranked, for example, based on one or more performance metrics. In some embodiments, for example, weighted ranking scores may be calculated for candidate compression types as:

$$\text{score} = s_1 \cdot w_1 + s_2 \cdot w_2 + \ldots s_n \cdot w_n$$

In some embodiments, the computing system (e.g., compression selector, etc.) can adjust the order of segments to be transferred based on prioritization. For example, segments which have higher importance or urgency of availability may be jumped in line. In some embodiments, segments with high priority may be sent without compression, with a compression type using high compression speed, and/or the like.

Processing proceeds to operation S260, where the computing system (e.g., server computer 200 of FIG. 1 or the like) generates compressed segments based on the compression type assigned for each different segment. As an example, a compressor/decompressor 350 of FIG. 3 and/or the like can provide for compressing the segments of the transfer data stream based on a selected/assigned compression type. In some embodiments, segments of the transfer data stream can be compressed based on a selected compression type, block size, compression level, and/or the like. In some embodiments, the computing system (e.g., compressor/decompressor, etc.) can adjust an order of segments to be transferred based on a detected/assigned priority.

In some embodiments, the computing system (e.g., compressor/decompressor, etc.) can provide for generating a compression sequence table and providing the compression sequence table along with the compressed segments of the transfer data stream. In some embodiments, the compression sequence table can include a compression type, block size, compression level, and/or the like for each different segment to be transferred.

Processing proceeds to operation S262, where the computing system (e.g., server computer 200 of FIG. 1 or the like) provides the compressed segments to a replication target. In some embodiments, the computing system can provide a compression sequence table to the replication target along with the compressed transfer data segments.

Optionally, in some embodiments, processing may proceed to operation S264, where the computing system (e.g., server computer 200 of FIG. 1 or the like) can obtain and decompress the compressed segments in the replication target. As an example, a compressor/decompressor 350 and/or the like can obtain the transferred compressed segments and decompress the compressed segments such that the transfer data stream can be replicated at the replication target. In some embodiments, the computing system (e.g., compressor/decompressor, etc.) can obtain and use a compression sequence table in decompressing the transferred segments. The compression sequence table may include a compression type, block size, compression level, and/or the like for each transferred segment. In some embodiments, the computing system (e.g., compressor/decompressor, etc.) may adjust the order of the segments based on a detected/assigned priority, for example, to allow higher importance data (e.g., "hot" data, etc.) to be available earlier at the replication target.

Further Comments and/or Embodiments

Additionally, some embodiments of the present disclosure can provide for updating and/or dynamically adjusting a compression knowledge base to adapt to current workload, database status, compression/decompression actions, and/or the like. For example, in some embodiments, a compression knowledge base may be adjusted based on measurements, predictions, feedback, and/or the like associated with compression/decompression actions, database status, workload, and/or the like. as an example, a computing system can analyze the usage pattern of divided segments and adjust compression methods based on analyzed data characteristics. Accordingly, in some embodiments, a computing system (e.g., server computer 200 of FIG. 1 or the like) can obtain metrics, predictions, feedback, and/or the like and use such data to adjust a compression knowledge base and/or compression use in data replication.

In an embodiment, an example of an entry in a compression knowledge base is as follows:
Example Compression Knowledge Base Entry

```
{
  "database": "dbA",
  "table": "tableA",
  "column": "columnA",
  "pattern": "pattern1",
  "workload": "0.58",
  "timestamp": "20200101000000-20200214235900"
  "compressionfactor": [{
      "algorithm": "snappy",
      "cost": [{
          "cpu": 3.65,
          "memory": 544
      }]
    },
    {
      "algorithm": "lz4",
      "cost": [{
          "cpu": 3.89,
          "memory": 3130
      }]
    }
  ]
}
```

Figure 4A:
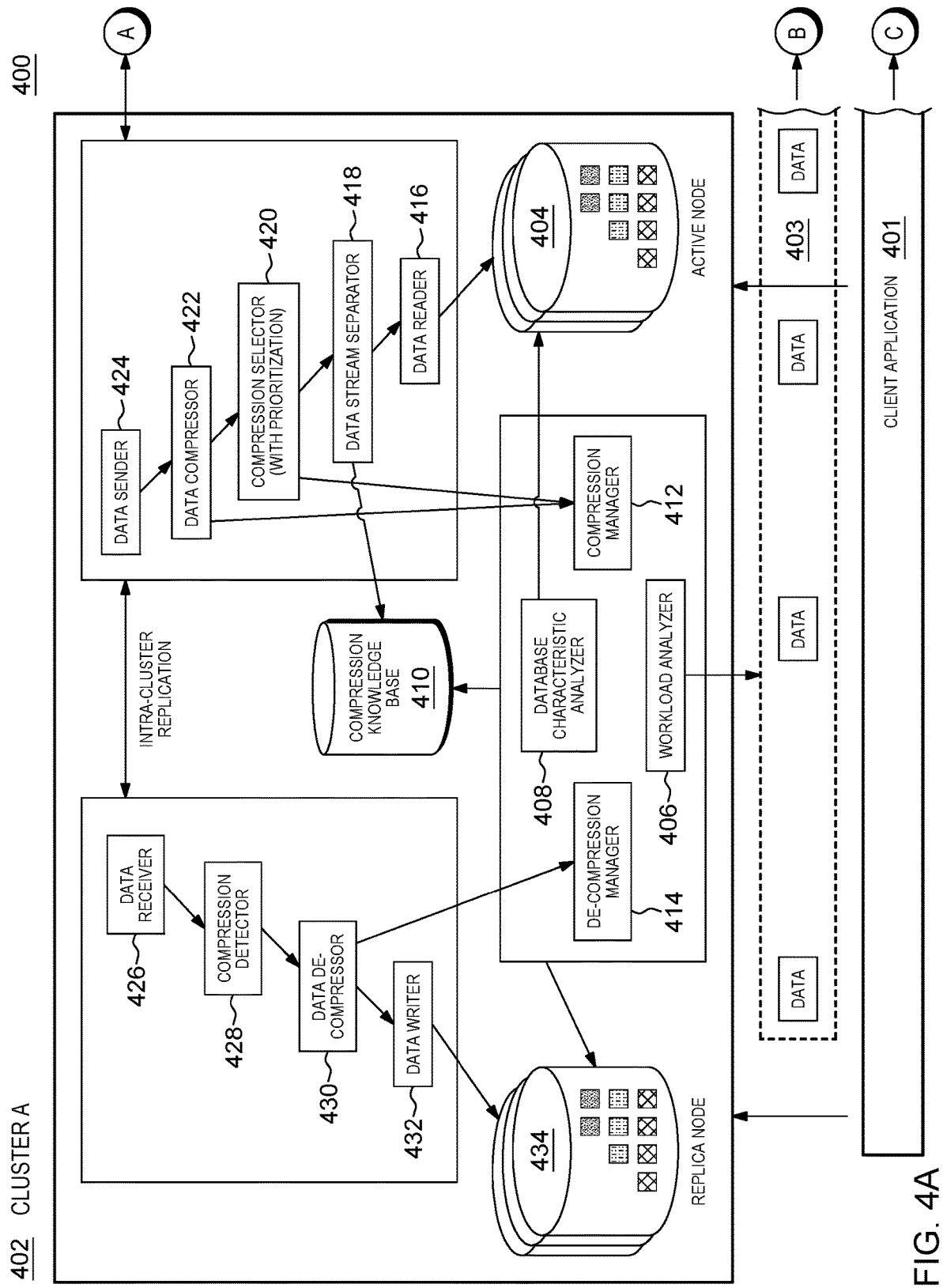
FIG. 4A and FIG. 4B depict a block diagram of an example system architecture for adaptive compression in database replication, according to embodiments of the present invention.
Figure 4B:
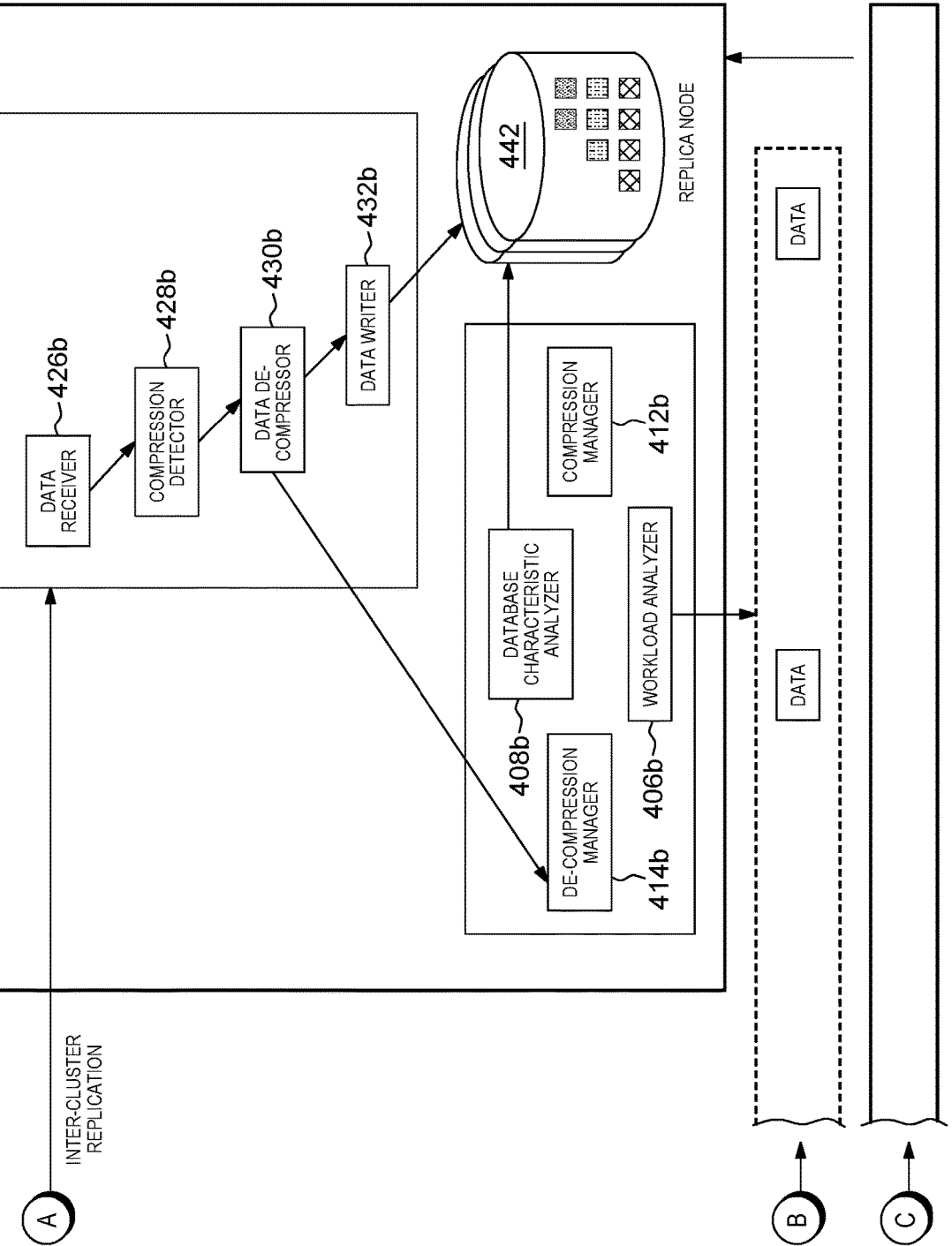

FIG. 4A and FIG. 4B depict a block diagram of an example system architecture 400 for adaptive compression in database replication, according to embodiments of the present invention. As illustrated in FIG. 4A and FIG. 4B, in some embodiments, an architecture 400 for adaptive compression for data replication may include client application 401, data 403, and multiple clusters, such as cluster A 402 and cluster B 440, over which data is to be replicated. For example, client application may access cluster A 402 and/or cluster B 440 in processing data 403. The architecture 400 can include one or more nodes, such as node 404, node 434, and node 442 associated with a cluster. Data can be written to and/or read from one or more of the nodes, such as node 404, and may be replicated from a node, such as node 404, to one or more other nodes, such as node 434 and/or node 442.

The architecture 400 can include a workload analyzer 406, 406b, a database characteristic analyzer 408, 408b, a compression manager 412, 412b, a decompression manager 414, 414b, and a compression knowledge base 410. In some embodiments, to provide for adaptive compression to be used in the data replication between an active node (e.g., node 404, etc.) and one or more replica nodes (e.g., node 434, node 442, etc.) as described herein, the architecture 400 can include a data reader 416, a data stream separator 418, a compression selector 420, a data compressor 422, a data sender 424, a data receiver 426, 426b, a compression detector 428, 428b, a data decompressor 430, 430b, and a data writer 432, 432b.

Figure 5:
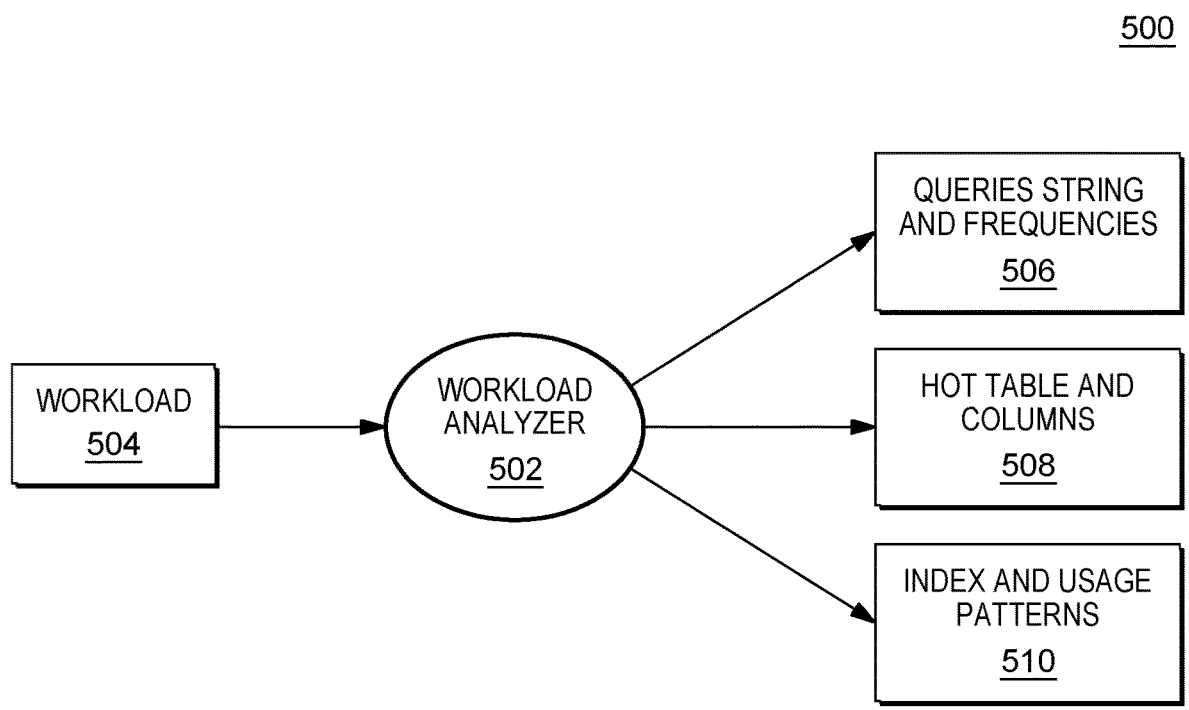
FIG. 5 depicts a block diagram of an example workload analyzer, according to embodiments of the present invention.

FIG. 5 depicts a block diagram of an example workload analyzer 500, according to embodiments of the present invention. In some embodiments, a workload 504 (e.g., database workload, etc.) can be obtained by a workload analyzer 502. The workload analyzer 502 can generate a set of workload queries 506 including query statements (e.g., SQL statements, etc.) and their individual frequencies of use. The workload analyzer 502 can identify frequently accessed tables and columns on the tables, for example, hot tables and columns 508. The workload analyzer 502 can also identify indexes that are used and the usage patterns on those indexes, for example, indexes and usage patterns 510.

Figure 6:
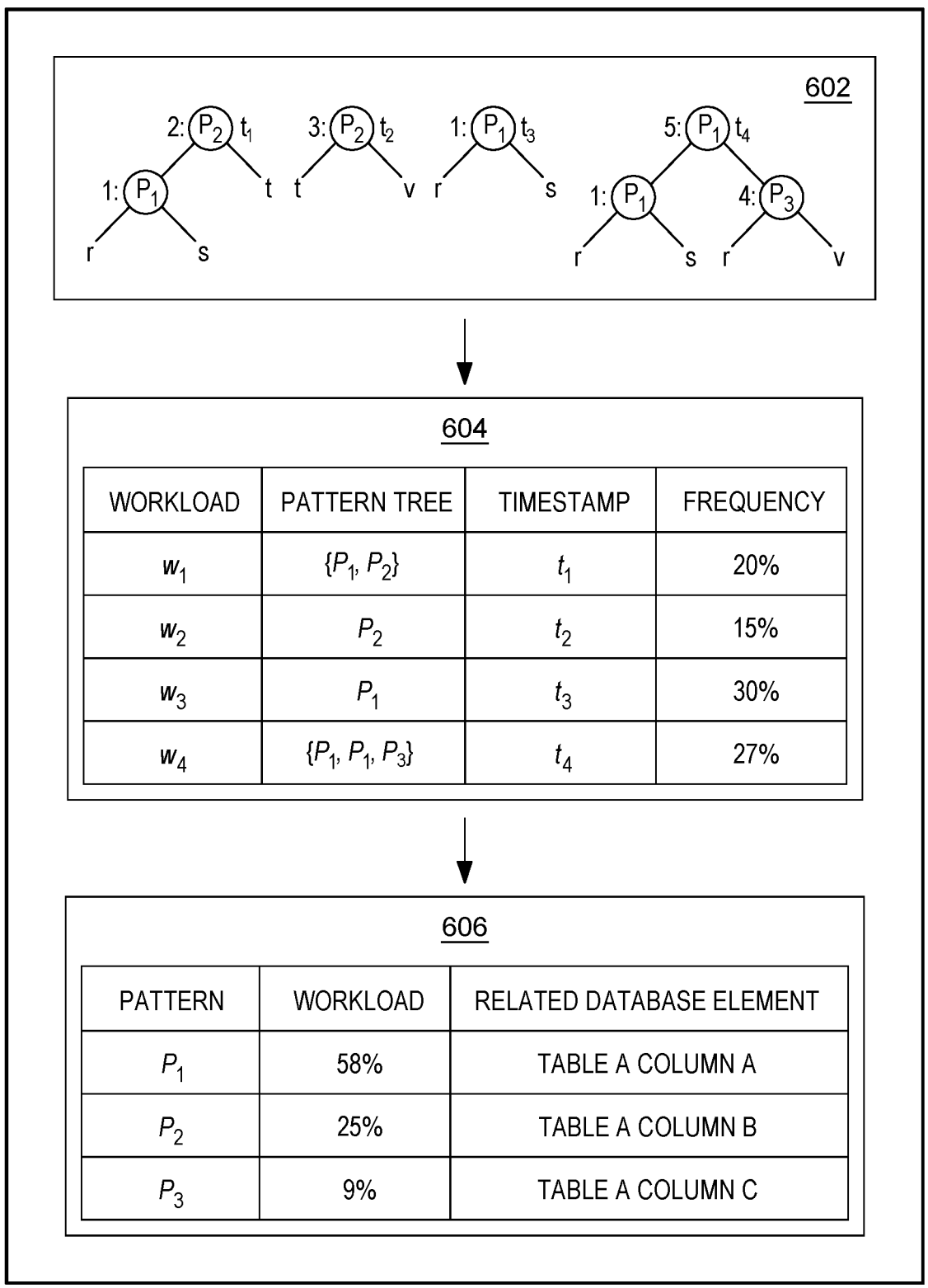
FIG. 6 depicts a block diagram of an example workload analysis, according to embodiments of the present invention.

FIG. 6 depicts a block diagram of an example workload analysis 600, according to embodiments of the present invention. In some embodiments, workload statistics may be collected from audit log(s). For example, as illustrated in FIG. 6, a syntax tree 602 can be constructed to represent a query. Different patterns can be identified and associated with workloads, such as workload pattern table 604, and related database elements, such as database element patterns table 606. In pattern tables 604 and 606 related columns in a same table are illustrated. In some embodiments, workload analysis can identify workloads and patterns in different tables, different views, different columns, different indexes, and/or the like.

Figure 7:
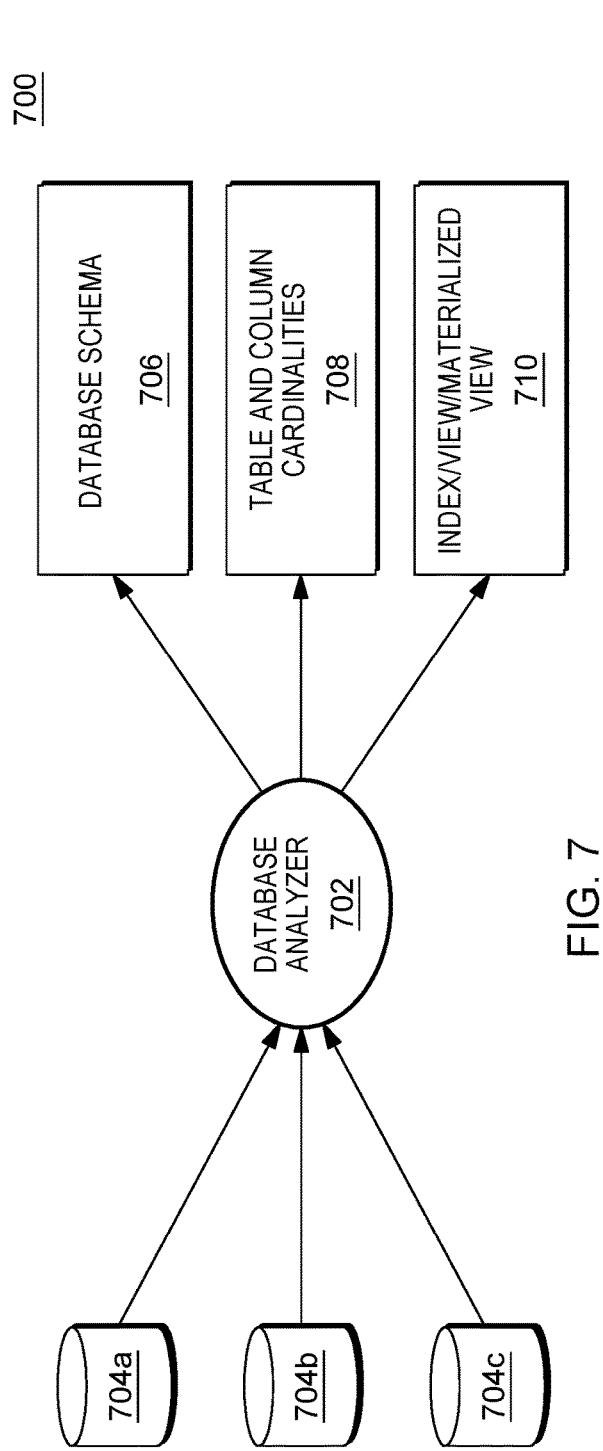
FIG. 7 depicts a block diagram of an example database analyzer, according to embodiments of the present invention.

FIG. 7 depicts a block diagram of an example database analyzer 700, according to embodiments of the present invention. As illustrated in FIG. 7, database data 704*a*, 704*b*, 704*c*, and/or the like can be obtained by database analyzer 702. The database analyzer 702 can analyze and identify the relational schema 706, table and/or column cardinalities 708, and/or design characteristics 710 (e.g., indexes, partitioning, views, materialized views, etc.) for use in determining adaptive compression for data to be replicated.

Figure 8:
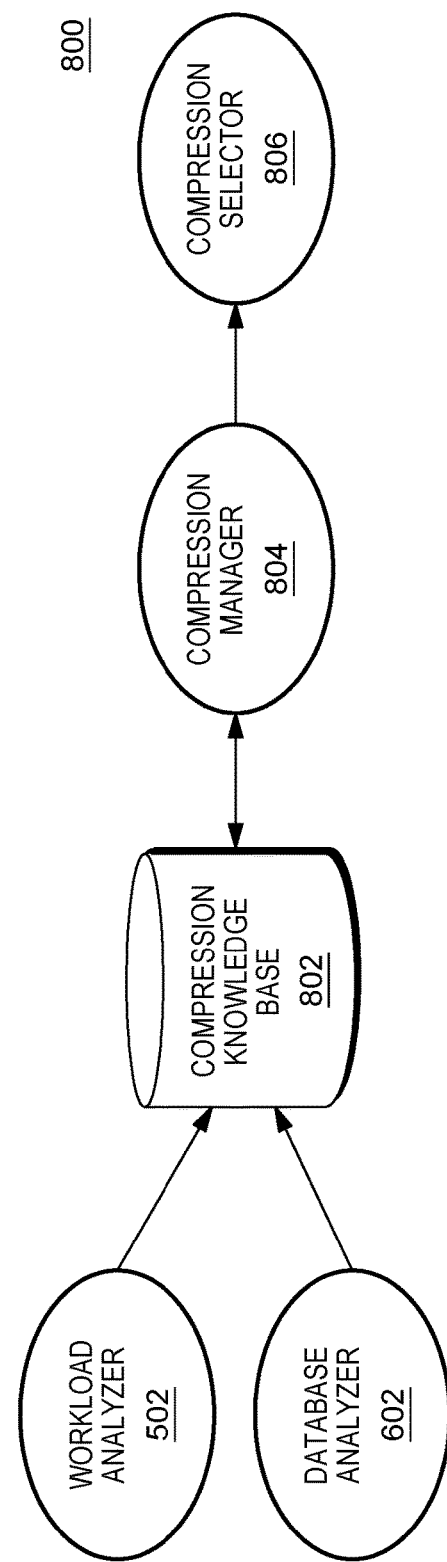
FIG. 8 depicts a block diagram of an example compression manager, according to embodiments of the present invention.

FIG. 8 depicts a block diagram of an example compression management architecture 800, according to embodiments of the present invention. As illustrated, in some embodiments, a compression manager 804 can build a compression knowledge base 802 based on output from a workload analyzer 502, a database analyzer 602, and/or the like. The compression manager 804 can provide real-time instruction to the compression selector 806 for use in determining adaptive compression. In some embodiments, a compression selector can provide data type(s), data metadata, and/or the like to the compression manager 804. The compression manager 804 can generate recommended compression type for data to be replicated including a library version and compression level to be used in the compression. In some embodiments, the compression manager 804 can dynamically adjust/update a compression knowledge base 802, for example, to adapt to current workload(s), database status, and/or the like.

Figure 9:
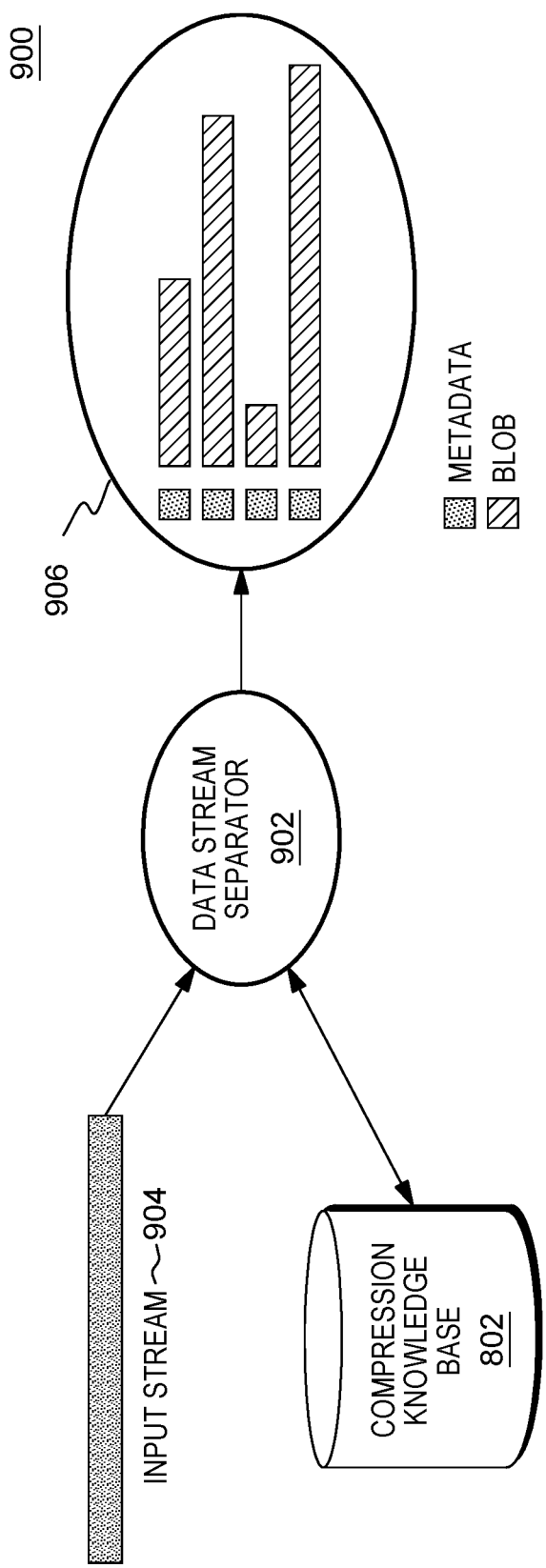
FIG. 9 depicts a block diagram of data stream separator, according to embodiments of the present invention.

FIG. 9 depicts a block diagram of data stream separator 900, according to embodiments of the present invention. As illustrated in FIG. 9. A data stream separator 902 can analyze an input data stream 904 identifying data type(s) and/or other characteristics to provide for dividing and/or merging the input stream 904 into different segments 906. The data stream separator 902 can access a compression knowledge base 802 for use in determining how to divide and/or merge the input stream 904.

Figure 10:
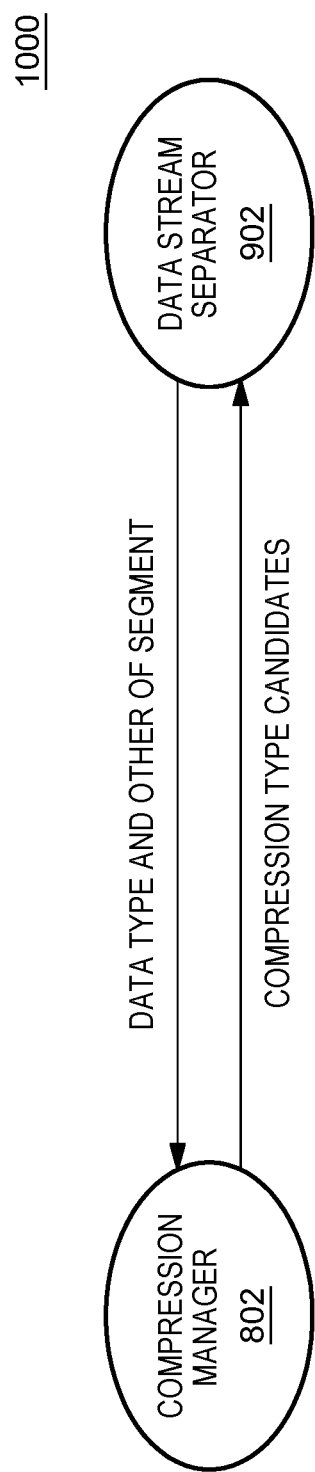
FIG. 10 depicts a block diagram of compression selection, according to embodiments of the present invention.

FIG. 10 depicts a block diagram of compression selection 1000, according to embodiments of the present invention. A compression selector 806 can obtain data type(s) and other characteristics for data stream segments (e.g., segments 906, etc.) from a data stream separator 902. The compression selector 806 can provide the data type(s) and other characteristics to a compression manager 804 and receive candidate compression types from the compression manager 804. The compression selector 806 can determine a compression type to be selected based in part on a current context. For example, the compression selection may be based on CPU utilization for compression/decompression, memory utilization for compression/decompression, network utilization for compression/decompression, and/or the like. In some embodiments, candidate compression types can be weight ranked based on one or more of the performances (e.g., CPU utilization, memory utilization, network utilization, etc.) and scores can be provided for use in making a compression selection. For example, a ranking score can be calculated as:

$$\text{Score} = S_1 \cdot w_1 + S_2 \cdot w_2 + \ldots S_N \cdot w_N$$

Figure 11:
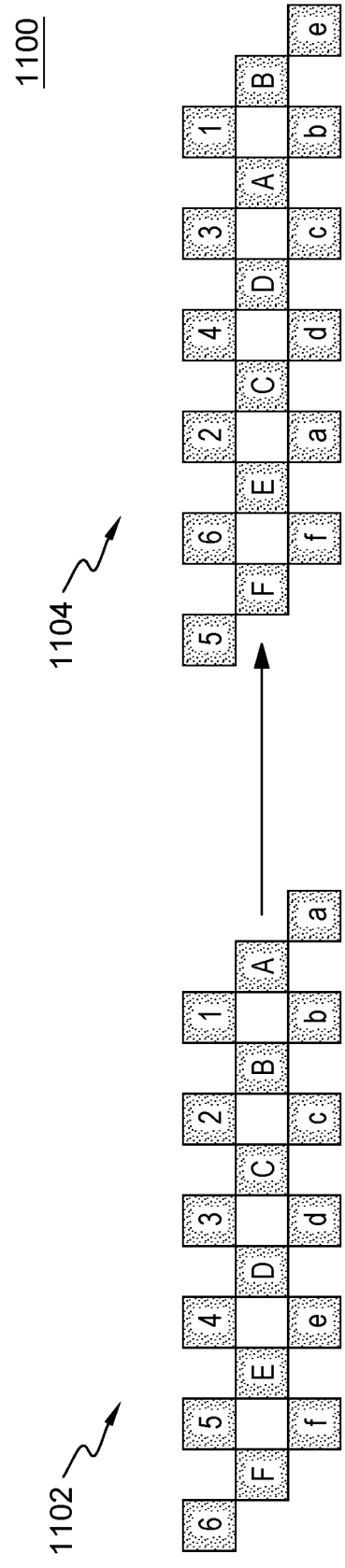
FIG. 11 depicts a block diagram of an example of compression segment prioritization, according to embodiments of the present invention.

FIG. 11 depicts a block diagram of an example of compression segment prioritization 1100, according to embodiments of the present invention. As illustrated in FIG. 11, in some embodiments, a compression selector and/or the like may adjust the segments to be transferred based on prioritization (e.g., importance, urgency of availability, etc.) and/or the like. For example, segments 1102 can be adjusted such that certain segments are reordered (e.g., jumped in line, etc.) into segments 1104 based on prioritization. For example, higher priority segments can be sent with no compression, with compression type having high compression/decompression speed, and/or the like.

Figure 12:
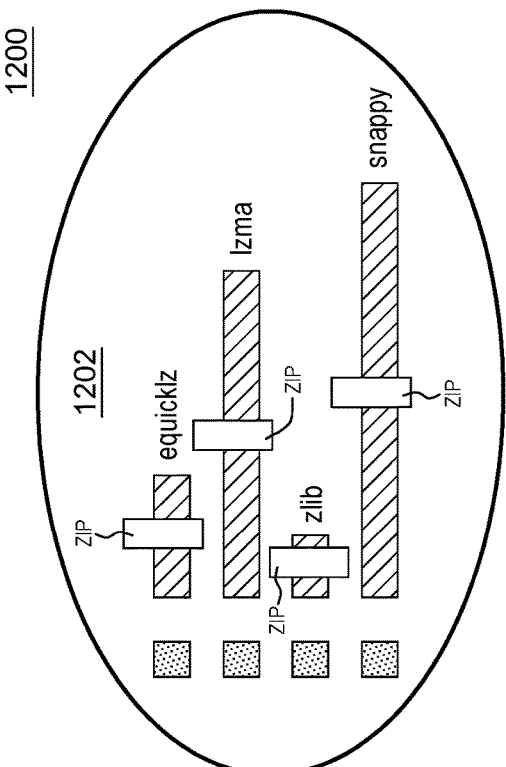
FIG. 12 depicts a block diagram of an example data compressor, according to embodiments of the present invention.

FIG. 12 depicts a block diagram of an example data compressor 1200, according to embodiments of the present invention. As illustrated in FIG. 12, a data compressor can obtain the segments 906 to be transferred along with selected compression type(s), block size(s), compression level(s), and/or the like. The data compressor can compress the data segments 906 into compressed data segments 1202 to be replicated to another node. In some embodiments, a data compressor may adjust the order of the segments based on a detected priority and/or the like.

Figure 13:
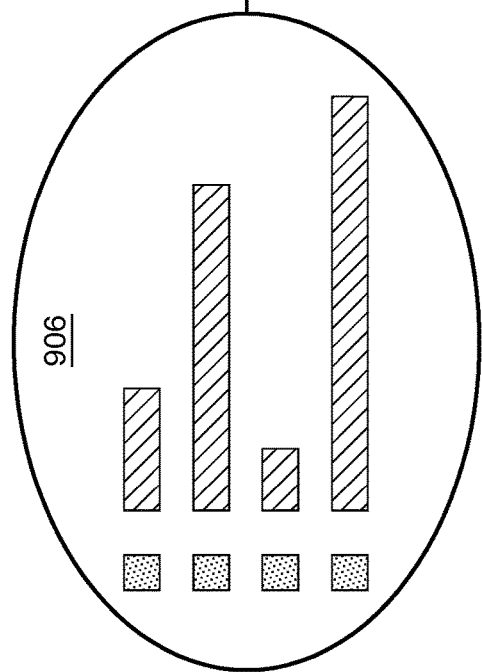
FIG. 13 depicts a block diagram of an example data decompressor, according to embodiments of the present invention.
Figure 13:
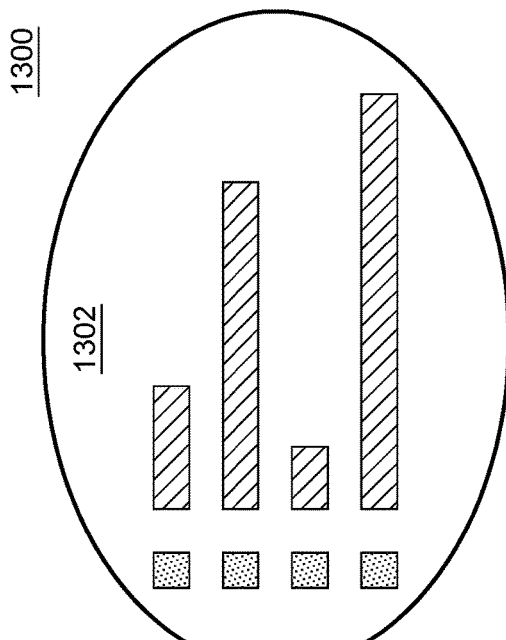

FIG. 13 depicts a block diagram of an example data decompressor 1300, according to embodiments of the present invention. As illustrated in FIG. 13, a data decompressor can obtain the compressed data segments 1202 being replicated (e.g., at a target node, etc.). In some embodiments, the data decompressor can obtain the selected compression type(s), block size(s), compression level(s), and/or the like. The data compressor can decompress the data segments 1202 into replicated data segments 1302, for example, based on the selected compression type(s), block size(s), compression level(s), and/or the like. In some embodiments, a data decompressor may adjust the order of the segments, for example, based on a detected priority and/or the like, such that higher priority data (e.g., hot data, etc.) can be available earlier at the replication target.

Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Data communication: any sort of data communication scheme now known or to be developed in the future, including wireless communication, wired communication and communication routes that have wireless and wired portions; data communication is not necessarily limited to: (i) direct data communication; (ii) indirect data communication; and/or (iii) data communication where the format, packetization status, medium, encryption status and/or protocol remains constant over the entire course of the data communication.

Receive/provide/send/input/output/report: unless otherwise explicitly specified, these words should not be taken to imply: (i) any particular degree of directness with respect to the relationship between their objects and subjects; and/or (ii) absence of intermediate components, actions and/or things interposed between their objects and subjects.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A computer-implemented method comprising:
in a data replication environment, analyzing, by one or more processors, a database workload to generate a knowledge base of information related to compression;
dividing, by the one or more processors, a transfer data stream into different segments based, at least in part, on the knowledge base;
obtaining, by the one or more processors, candidate compression types for the transfer data stream based, at least in part, on the knowledge base;
assigning, by the one or more processors, respective compression types of the candidate compression types to the different segments;
generating, by the one or more processors, compressed segments based, at least in part, on the respective compression types assigned to the different segments; and
providing, by the one or more processors, the compressed segments to a replication target, wherein providing the compressed segments to the replication target includes providing a compression sequence table along with the compressed segments to the replication target and decompressing the compressed segments such that the transfer data stream can be replicated at the replication target.

2. The computer-implemented method of claim 1, wherein analyzing the database workload to generate the knowledge base of information related to compression includes:
generating, by the one or more processors, a set of workload queries and individual frequencies of use for the workload queries;
determining, by the one or more processors, frequently accessed tables;
determining, by the one or more processors, columns on the frequently accessed tables;
determining, by the one or more processors, indexes used by the database workload; and
determining, by the one or more processors, usage patterns for the indexes.

3. The computer-implemented method of claim 2, wherein analyzing the database workload to generate the knowledge base of information related to compression further includes:
analyzing, by the one or more processors, a database relational schema;
analyzing, by the one or more processors, cardinalities of database tables; and
analyzing, by the one or more processors, column cardinalities.

4. The computer-implemented method of claim 1, wherein the knowledge base includes:
a plurality of managed database elements;
related workload and time span measurements;
resource costing for different compression and decompression types; and
predictions for future cost.

5. The computer-implemented method of claim 1, wherein obtaining the candidate compression types for the transfer data stream includes:
obtaining, by the one or more processors, information associated with the transfer data stream including data type information and data metadata; and
determining, by the one or more processors, candidate compression types based on the information associated with the transfer data stream, wherein a library version and compression level are provided for each candidate compression type.

6. The computer-implemented method of claim 1, wherein:
generating, by the one or more processors, the compressed segments based, at least in part, on the respective compression types assigned to the different segments includes generating the compression sequence table.

7. The computer-implemented method of claim 6, wherein the compression sequence table includes a compression type, a block size, and a compression level for each different segment transferred.

8. The computer-implemented method of claim 1, further comprising:
dynamically adjusting, by the one or more processors, the knowledge base based, at least in part, on a current workload and a database status.

9. A computer program product comprising a computer readable storage medium, excluding a transitory signal per se, having stored thereon: program instructions programmed to, in a data replication environment, analyze a database workload to generate a knowledge base of information related to compression; program instructions programmed to divide a transfer data stream into different segments based, at least in part, on the knowledge base; program instructions programmed to obtain candidate compression types for the transfer data stream based, at least in part, on the knowledge base; program instructions programmed to assign respective compression types of the candidate compression types to the different segments; program instructions programmed to generate compressed segments based, at least in part, on the respective compression types assigned to the different segments; and program instructions programmed to provide the compressed segments to a replication target, wherein providing the compressed segments to the replication target includes providing a compression sequence table along with the compressed segments to the replication target and decompressing the compressed segments such that the transfer data stream can be replicated at the replication target.

10. The computer program product of claim 9, wherein analyzing the database workload to generate the knowledge base of information related to compression includes:
- generating a set of workload queries and individual frequencies of use for the workload queries;
- determining frequently accessed tables;
- determining columns on the frequently accessed tables;
- determining indexes used by the database workload;
- determining usage patterns for the indexes;
- analyzing a database relational schema;
- analyzing cardinalities of database tables; and
- analyzing column cardinalities.

11. The computer program product of claim 9, wherein the knowledge base includes:
- a plurality of managed database elements;
- related workload and time span measurements;
- resource costing for different compression and decompression types; and
- predictions for future cost.

12. The computer program product of claim 9, wherein obtaining the candidate compression types for the transfer data stream includes:
- obtaining information associated with the transfer data stream including data type information and data metadata; and
- determining candidate compression types based on the information associated with the transfer data stream, wherein a library version and compression level are provided for each candidate compression type.

13. The computer program product of claim 9, wherein:
- generating the compressed segments based, at least in part, on the respective compression types assigned to the different segments includes generating the compression sequence table; and
- the compression sequence table includes a compression type, a block size, and a compression level for each different segment transferred.

14. The computer program product of claim 9, the computer readable storage medium having further stored thereon:
- program instructions programmed to dynamically adjust the knowledge base based, at least in part, on a current workload and a database status.

15. A computer system comprising:
- a processor set; and
- a computer readable storage medium;
- wherein:
    - the processor set is structured, located, connected, and programmed to run program instructions stored on the computer readable storage medium; and
    - the stored program instructions include:
        - program instructions programmed to, in a data replication environment, analyze a database workload to generate a knowledge base of information related to compression;
        - program instructions programmed to divide a transfer data stream into different segments based, at least in part, on the knowledge base;
        - program instructions programmed to obtain candidate compression types for the transfer data stream based, at least in part, on the knowledge base;
        - program instructions programmed to assign respective compression types of the candidate compression types to the different segments;
        - program instructions programmed to generate compressed segments based, at least in part, on the respective compression types assigned to the different segments; and
        - program instructions programmed to provide the compressed segments to a replication target, wherein providing the compressed segments to the replication target includes providing a compression sequence table along with the compressed segments to the replication target and decompressing the compressed segments such that the transfer data stream can be replicated at the replication target.

16. The computer system of claim 15, wherein analyzing the database workload to generate the knowledge base of information related to compression includes:
- generating a set of workload queries and individual frequencies of use for the workload queries;
- determining frequently accessed tables;
- determining columns on the frequently accessed tables;
- determining indexes used by the database workload;
- determining usage patterns for the indexes;
- analyzing a database relational schema;
- analyzing cardinalities of database tables; and
- analyzing column cardinalities.

17. The computer system of claim 15, wherein the knowledge base includes:
- a plurality of managed database elements;
- related workload and time span measurements;
- resource costing for different compression and decompression types; and
- predictions for future cost.

18. The computer system of claim 15, wherein obtaining the candidate compression types for the transfer data stream includes:
- obtaining information associated with the transfer data stream including data type information and data metadata; and
- determining candidate compression types based on the information associated with the transfer data stream, wherein a library version and compression level are provided for each candidate compression type.

19. The computer system of claim 15, wherein:
- generating the compressed segments based, at least in part, on the respective compression types assigned to the different segments includes generating the compression sequence table; and
- the compression sequence table includes a compression type, a block size, and a compression level for each different segment transferred.

20. The computer system of claim 15, the stored program instructions further comprising:
- program instructions programmed to dynamically adjust the knowledge base based, at least in part, on a current workload and a database status.

\* \* \* \* \*